(12) United States Patent
Kuechenmeister et al.

(10) Patent No.: US 9,570,430 B2
(45) Date of Patent: Feb. 14, 2017

(54) ARTICLES INCLUDING BONDED METAL STRUCTURES AND METHODS OF PREPARING THE SAME

(71) Applicant: GLOBALFOUNDRIES, Inc., Grand Cayman (KY)

(72) Inventors: Frank Kuechenmeister, Dresden (DE); Christian Klewer, Dresden (DE); Jens Oswald, Dresden (DE)

(73) Assignee: GLOBALFOUNDRIES, INC., Grand Cayman (KY)

(*) Notice: Subject to any disclaimer, the term of this patent is extended or adjusted under 35 U.S.C. 154(b) by 0 days.

(21) Appl. No.: 14/709,924

(22) Filed: May 12, 2015

(65) Prior Publication Data
US 2015/0333035 A1    Nov. 19, 2015

Related U.S. Application Data

(60) Provisional application No. 61/992,314, filed on May 13, 2014.

(51) Int. Cl.
*H01L 25/00* (2006.01)
*H01L 23/00* (2006.01)
(Continued)

(52) U.S. Cl.
CPC ............. *H01L 25/50* (2013.01); *H01L 24/11* (2013.01); *H01L 24/16* (2013.01); *H01L 24/48* (2013.01); *H01L 24/85* (2013.01); *H01L 25/0657* (2013.01); *H01L 23/3114* (2013.01); *H01L 2224/0401* (2013.01); *H01L 2224/04042* (2013.01); *H01L 2224/16145* (2013.01); *H01L 2224/48097* (2013.01); *H01L 2224/48227* (2013.01); *H01L 2224/73207* (2013.01); *H01L 2224/85002* (2013.01); *H01L 2224/92127* (2013.01); *H01L 2224/94* (2013.01);
(Continued)

(58) Field of Classification Search
CPC .. H01L 24/48; H01L 23/522; H01L 21/76804; H01L 25/50; H01L 24/16; H01L 24/85; H01L 23/3114; H01L 25/0657
See application file for complete search history.

(56) References Cited

U.S. PATENT DOCUMENTS 6,720,660 B1 * 4/2004 Ushiyama ......... H01L 21/02126
257/632
6,838,355 B1 * 1/2005 Stamper ............ H01L 21/76801
257/E21.576

(Continued)

*Primary Examiner* — Nathan W Ha
(74) *Attorney, Agent, or Firm* — Lorenz & Kopf, LLP (57) ABSTRACT

Articles including bonded metal structures and methods of preparing the same are provided herein. In an embodiment, a method of preparing an article that includes bonded metal structures includes providing a first substrate. A first metal structure and a second metal structure are formed on the first substrate. The first metal structure and the second metal structure each include an exposed contact surface. A bond mask is formed over the contact surface of the first metal structure. A second substrate is bonded to the first substrate through the exposed contact surface of the second metal structure. The bond mask remains disposed over the exposed contact surface of the second metal structure during bonding of the second substrate to the first substrate. A wire is bonded to the exposed contact surface of the first metal structure.

14 Claims, 5 Drawing Sheets

(51) Int. Cl.
*H01L 25/065* (2006.01)
*H01L 23/31* (2006.01)

(52) U.S. Cl.
CPC ............... *H01L 2225/0651* (2013.01); *H01L 2225/06513* (2013.01); *H01L 2225/06568* (2013.01); *H01L 2924/14* (2013.01)

(56) References Cited

U.S. PATENT DOCUMENTS

| | | | | |
|---|---|---|---|---|
| 2005/0167842 | A1* | 8/2005 | Nakamura | H01L 23/522 257/758 |
| 2009/0096094 | A1* | 4/2009 | Tetani | H01L 23/3114 257/737 |
| 2011/0304030 | A1* | 12/2011 | Yamada | H01L 24/05 257/635 |
| 2012/0080662 | A1* | 4/2012 | Saito | H01L 21/28556 257/29 |
| 2013/0134585 | A1* | 5/2013 | Stuber | H01L 27/0688 257/737 |

* cited by examiner

ARTICLES INCLUDING BONDED METAL STRUCTURES AND METHODS OF PREPARING THE SAME

CROSS-REFERENCE TO RELATED APPLICATIONS

This application claims the benefit of U.S. Provisional Application No. 61/992,314, filed May 13, 2014.

TECHNICAL FIELD

The technical field generally relates to articles that included bonded metal structures and methods of preparing the same. More particularly, the technical field relates to articles that include substrates having integrated circuits with the substrates bonded through metal structures, and methods of preparing the same.

BACKGROUND

A system-in-package (SIP), also known as a chip stack, generally includes a number of integrated circuits packaged in a single module. In the SIPs, dies containing integrated circuits may be stacked vertically on a substrate, such as another die or a wafer. Unlike electrical connections within an integrated circuit stack, which are formed during fabrication of the integrated circuits themselves, the dies do not have pre-existing electrical connections to the substrate and such electrical connections between the die and the substrate are established after the dies are formed and during fabrication of the SIPs.

Various methodologies may be employed to electrical connect the dies to the substrate in the SIPs. For example, wire bonding or flip chip technology may be employed to electrically connect the dies to the substrate. With wire bonding, a bond pad that is electrically connected to die is connected to a bond pad on the substrate through a fine off-chip wire. Wire bonding generally offers excellent design flexibility, with a wide range of possibilities for bond pad locations while still enabling connection through the wire.

Flip chip technology, also known as controlled collapse chip connection, enables electrical connection of the die to the substrate through solder bumps that have been formed on the die. The solder bumps are formed on a top side of the die and, in order to mount the chip to external circuitry on the substrate (e.g., a circuit board on another die or wafer), it is flipped over so that its top side faces down, and aligned so that the solder bumps align with matching pads on the substrate. The solder is then reflowed to complete the interconnect. This is in contrast to wire bonding, in which the chip is mounted upright and wires are used to interconnect the chip pads to external circuitry. Flip chip technology offers more efficient electrical connection between the die and the substrate than wire bonding, with the possibility for simultaneously forming numerous electrical interconnects between the die and the substrate. However, design flexibility is compromised with flip chip technology due to the need to have the solder bumps and corresponding bond pads in alignment. However, wire bonding and flip chip technology are generally incompatible due to the uniform nature of solder bump formation across all bond pads on the die when flip chip technology is employed.

Accordingly, it is desirable to provide articles including bonded metal structures and methods of forming the same in a manner that enables efficient electrical connection between the metal structures while also enabling design flexibility. Furthermore, other desirable features and characteristics will become apparent from the subsequent detailed description and the appended claims, taken in conjunction with the accompanying drawings and this background.

BRIEF SUMMARY

Articles including bonded metal structures and methods of preparing the same are provided herein. In an embodiment, a method of preparing an article that includes bonded metal structures includes providing a first substrate. A first metal structure and a second metal structure are formed on the first substrate. The first metal structure and the second metal structure each include an exposed contact surface. A bond mask is formed over the contact surface of the first metal structure. A second substrate is bonded to the first substrate through the exposed contact surface of the second metal structure. The bond mask remains disposed over the exposed contact surface of the second metal structure during bonding of the second substrate to the first substrate. A wire is bonded to the exposed contact surface of the first metal structure.

In another embodiment, an article that includes bonded metal structures is provided. The article includes a first substrate having a first metal structure and a second metal structure. The first metal structure and the second metal structure have exposed contact surfaces. A second substrate is bonded to the first substrate through the exposed contact surface of the second metal structure in the absence of a bond between the second substrate and the exposed contact surface of the first metal structure. A wire is bonded to the exposed contact surface of the first metal structure.

In another embodiment, an article that includes bonded metal structures is provided. The article includes a first substrate having a first metal structure and a second metal structure. The first metal structure and the second metal structure have exposed contact surfaces. A bond mask is disposed over the exposed contact surface of the first metal structure. The second metal structure is free from the bond mask disposed thereover. A second substrate is bonded to the first substrate through the exposed contact surface of the second metal structure. A wire is bonded to the exposed contact surface of the first metal structure through the bond mask that is disposed over the exposed contact surface of the first metal structure. The article further includes a third substrate that is separate from the first substrate and the second substrate and the wire is further connected to the third substrate.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the articles including bonded metal structures and methods of forming the same as described herein. Furthermore, there is no intention to be bound by any theory presented in the preceding background or the following detailed description.

Embodiments of the present disclosure are generally directed to articles that include integrated circuits and methods for forming the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Articles that included bonded metal structures and methods of preparing the articles are described herein. In particular, the articles include a first substrate and a second substrate with the first substrate and the second substrate bonded to each other through exposed contact surfaces of respective metal structures thereof (e.g., through a flip chip interconnect configuration such as a standard metal pillar or metal diffusion bond). Further, a wire is bonded to an exposed contact surface of another metal structure of the first substrate. As such, a combination of wire bonding to the first substrate and flip chip interconnect bonding is implemented in the articles described herein. The combination of wire bonding and flip chip interconnect bonding may be achieved by selectively masking the exposed contact surface of one of the metal structures, with the mask remaining in place during flip chip interconnect bonding, thereby shielding the exposed contact surface of the masked metal structure from conditions during flip chip interconnect bonding. The wire bond may be formed by either pushing a wire through the mask or by removing the mask followed by wire bonding. The resulting article includes both the wire bond and the flip chip interconnect bond, thereby enabling efficient electrical connection of the first substrate and the second substrate while also enabling design flexibility associated with wire bonding.

An exemplary embodiment of a method of preparing an article including bonded metal structures will now be described with reference to FIGS. 1-13. In accordance with an embodiment and referring to FIG. 1, a first substrate 10 is provided. The substrate 10 is not particularly limited and may be any substrate 10 upon or within which any metal structure may be formed. In an embodiment, the substrate 10 includes semiconductor or dielectric material, which materials are particularly useful in layers of integrated circuits. Examples of suitable dielectric materials include, but are not limited to, oxides and nitrides such as, for example, a silicon oxide or a silicon nitride, respectively. Although not shown in detail in the Figures, the first substrate may have a first electronic device, such as an integrated circuit, formed therein. In embodiments, the first substrate is a die or a wafer that includes the first electronic device formed therein.

Figure 1:
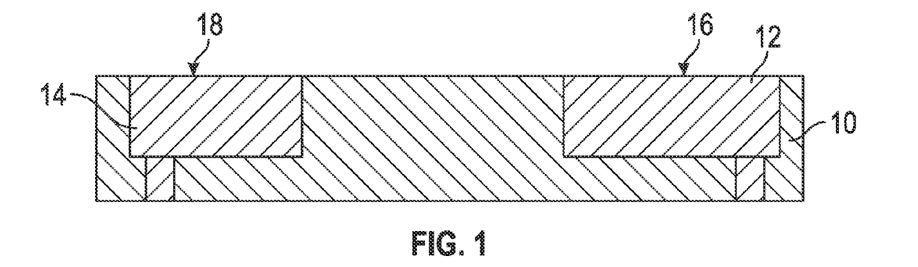
FIGS. 1-13 illustrate a method of preparing an article including bonded metal structures in accordance with an exemplary embodiment.

A first metal structure 12 and a second metal structure 14 are formed on the first substrate 10. By "on" as referred to herein, it is meant that the first metal structure 12 and the second metal structure 14 are disposed on a surface of the first substrate 10 and/or are embedded within the first substrate 10 with surfaces of the first metal structure 12 and second metal structure 14 exposed and optionally being on substantially even plane with a surface of the first substrate 10. The first metal structure 12 and the second metal structure each have an exposed contact surface 16, 18. By "exposed contact surface", it is meant a surface 16, 18 of the first metal structure 12 and the second metal structure 14, respectively, that is exposed in the first substrate 10 after forming the first substrate 10 but prior to deposition of further structure over the first substrate 10. The first metal structure 12 and the second metal structure 14 may be interconnects that are formed in the first substrate 10 and that connect to the first electronic device. The first metal structure 12 and the second metal structure 14 exhibit excellent electrical conductivity. Suitable materials for the first metal structure 12 and the second metal structure 14 include, but are not limited to, metals such as copper.

Figure 2:
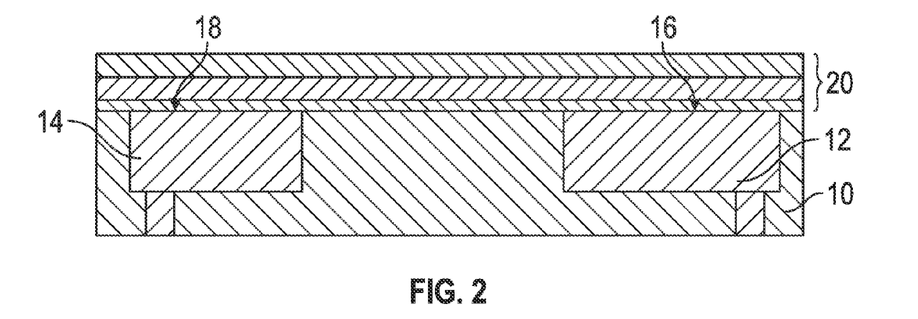
Figure 3:
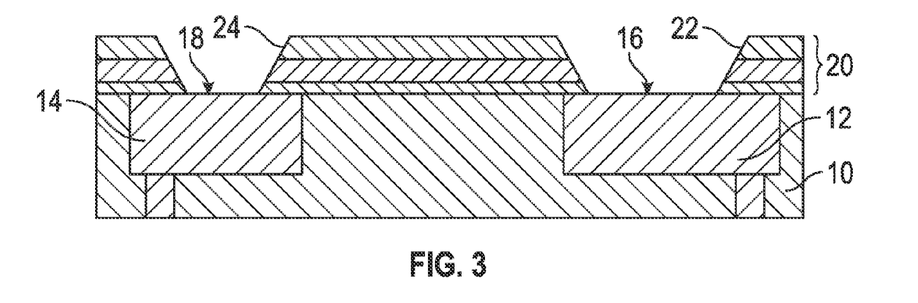

In an embodiment and referring to FIG. 2, a dielectric structure 20 is formed over the first substrate 10 in anticipation of forming a metal pillar over the second metal structure 14 in accordance with conventional flip chip interconnect bonding. The dielectric structure 20 may include one or more layers to enable selective etching of the dielectric structure 20 over the metal structures 12, 14. Referring to FIG. 3, recesses 22, 24 are etched through the dielectric structure 20 to expose the exposed contact surfaces 16, 18 of the respective metal structures 12, 14. Conventional lithography techniques may be employed to form the recesses 22, 24, and appropriate etchants for the materials of the dielectric structure 20 may be employed.

Figure 4:
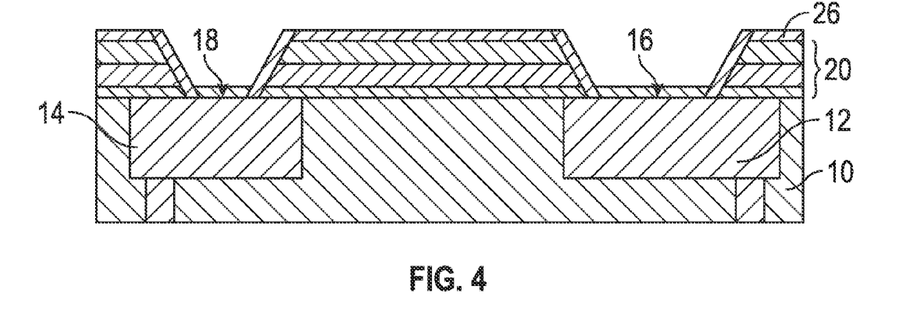

Referring to FIG. 4, a bond mask 26 is formed over the exposed contact surface 16 of the first metal structure 12, in the recesses 22, 24 and over the remaining portions of the dielectric structure 20. The bond mask 26 may include dielectric material that can be selectively etched from the metal of the first metal structure 12 and the second metal structure 14. One example of a suitable material for the bond mask 26 is nitrogen-doped silicon carbide (NBLoK). As shown in FIG. 4, the bond mask 26 may be blanket-formed over the dielectric structure 20 and in the recesses 22, 24, over the exposed contact surfaces 16, 18 of the first metal structure 12 and the second metal structure 14, respectively.

Figure 5:
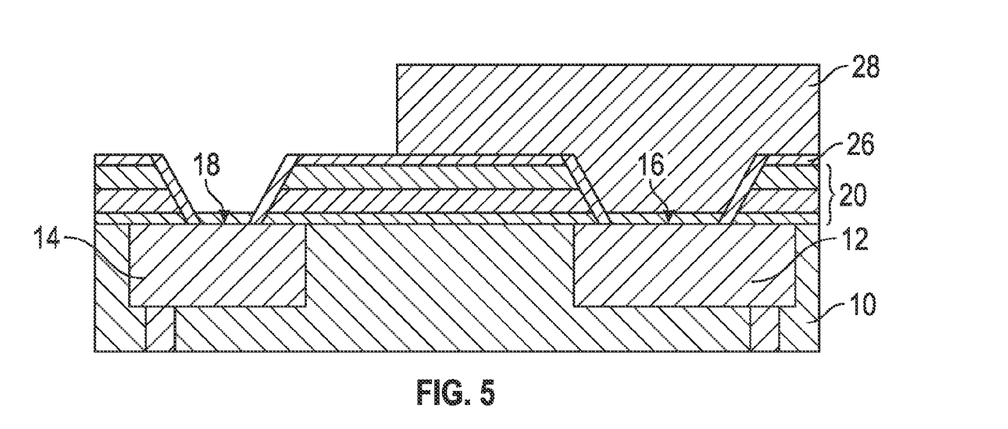
Figure 6:
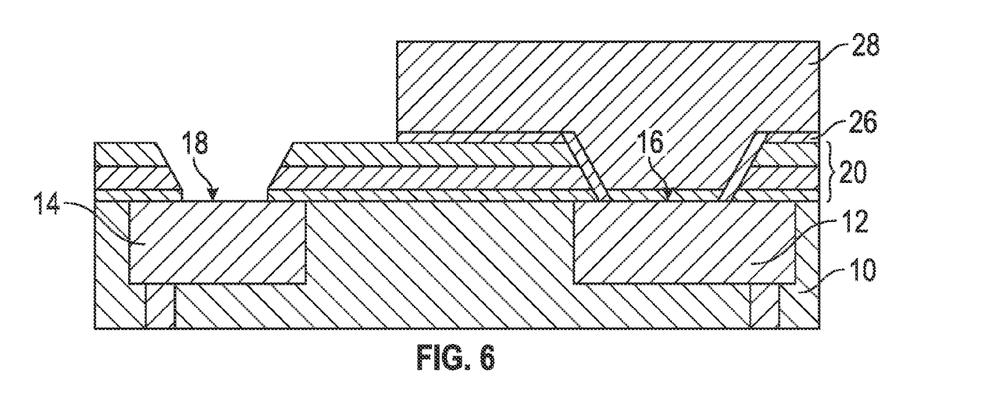
Figure 7:
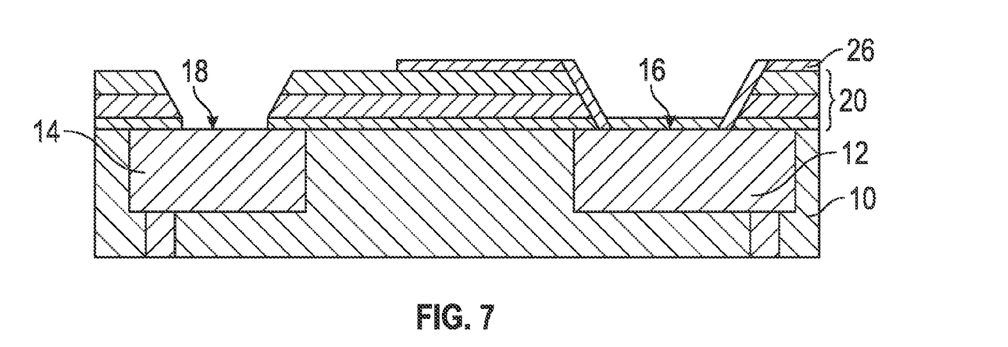
Figure 8:
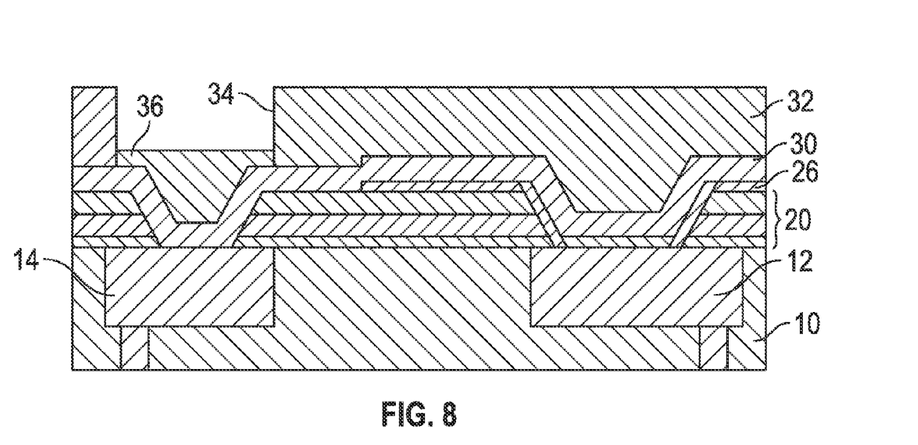
Figure 9:
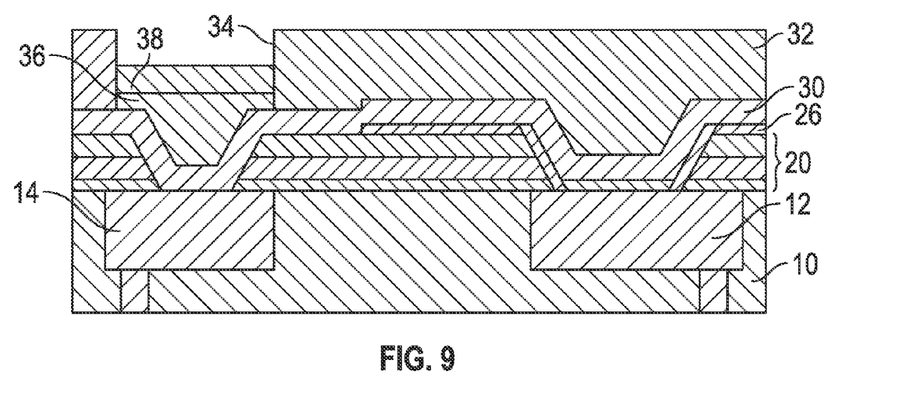
Figure 10:
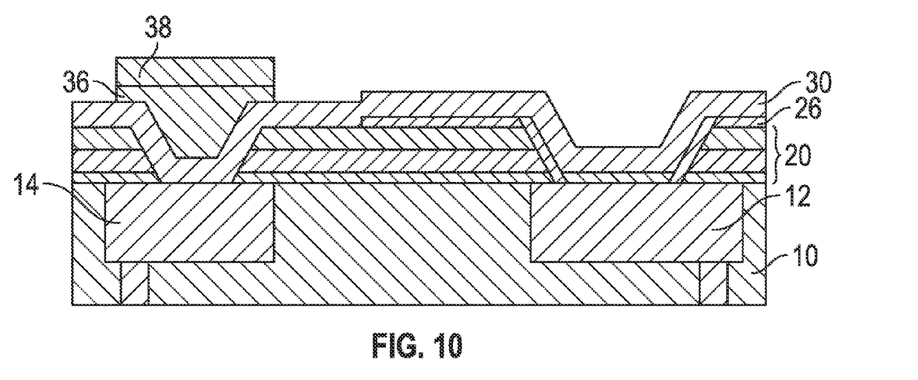

The bond mask 26 will remain in place over the first metal structure 12 but is selectively removed from over the exposed contact surface 18 of the second metal structure 14 such that the second metal structure is free from the bond mask disposed thereover, as shown in FIGS. 5-7. For example, to selectively remove the bond mask 26 from over the exposed contact surface 18 of the second metal structure 14 and referring to FIG. 5, a resist 28 may be deposited over the bond mask 26 and patterned to expose portions of the bond mask 26 that overlie the second metal structure 14. After patterning the resist 28 and referring to FIG. 6, exposed portions of the bond mask 26 may be selectively etched using an appropriate etchant to remove the bond mask 26 from over the exposed contact surface 18 of the second metal structure 14 and exposed dielectric structure 20. After selective etching of the bond mask 26 over the exposed contact surface 18 of the second metal structure 14 and referring to FIG. 7, the resist may be removed to expose the bond mask 26 that remains in place over the exposed contact surface 16 of the first metal structure 12.

In an embodiment and referring to FIGS. 8-13, a metal pillar and solder bump are formed over the second metal structure 14 to facilitate later formation of the flip chip interconnect bond. For example, referring to FIG. 8, an under-bump metallization (UBM) layer 30 may be formed over the exposed contact surface 18 of the second metal structure 14, as well as over the dielectric structure 20 and the remaining portion of the bond mask 26 that is disposed over the contact surface 16 of the first metal structure 12. A second resist 32 may be formed and patterned over the UBM layer 30 in anticipation of metal pillar formation. In particular, the second resist 32 may be patterned through conventional lithography techniques to define a pillar recess 34 over the UBM layer 30 that overlies the second metal structure 14. The second resist 32 masks the bond mask 26 and is free from a pillar recess over the first metal structure 12, thereby effectively blocking metal pillar formation on the first metal structure 12. A metal pillar 36 may be formed in the pillar recess 34. For example, the metal pillar 36 may be formed by plating a metal such as copper over the UBM layer 30. With the second resist 32 remaining in place, plating results in isolated metal deposition in the pillar recess 34.

Figure 11:
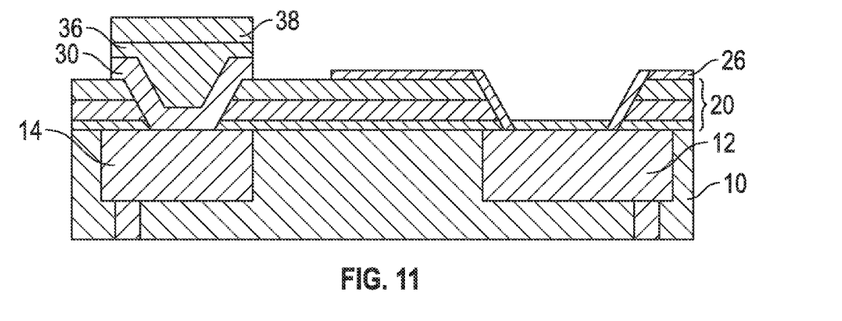
Figure 12:
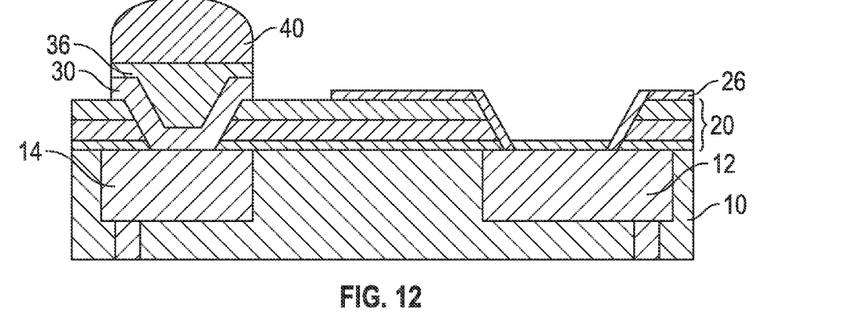

Referring to FIGS. 9-12, a solder bump is formed over the exposed contact surface of the second metal structure 14. In particular, in an embodiment and referring to FIG. 9, a solder layer 38 is formed over the metal pillar 36 by depositing solder material onto the metal pillar 36. Suitable solder materials include any conventional solder compositions employed in flip chip interconnect bonding. The second resist 32 may remain in place during deposition of the solder material to isolate deposition of the solder material over the metal pillar 36. After formation of the solder layer 38 and referring to FIG. 10, the second resist may be removed to expose the UBM layer 30. Referring to FIG. 11, exposed portions of the UBM layer 30 are selectively etched to expose the bond mask 26 and portions of the dielectric structure 20. Referring to FIG. 12, a solder reflow technique may then be employed to form a solder bump 40 in anticipation of flip chip interconnect bonding employing the solder bump 40. The metal pillar 36 and solder bump 40 provide a raised structure relative to the first metal structure 12, thereby enabling convenient flip chip interconnect bonding at the solder bump 40.

Figure 13:
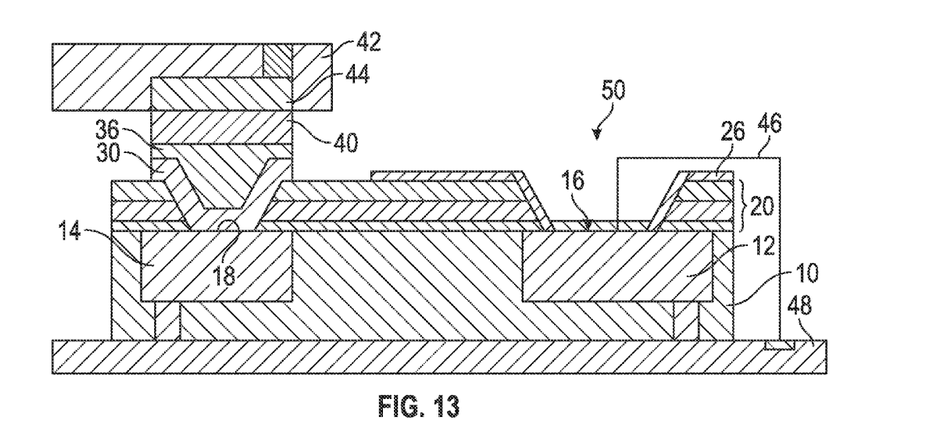

Referring to FIG. 13, a second substrate 42 may be bonded to the first substrate 10 through the exposed contact surface 18 of the second metal structure 14, in particular through the solder bump 40 and metal pillar 36. The second substrate 42 may include a second electronic device (such as another integrated circuit) and the second substrate 42 may have a corresponding metal structure 44 positioned to bond to the solder bump 40. In embodiments, the second substrate 42 is another die and bonding of the first substrate 10 and the second substrate 42 may be die-to-wafer or die-to-die bonding. The bond mask 26 remains disposed over the exposed contact surface 16 of the first metal structure 12 during bonding of the second substrate 42 to the first substrate 10 to protect the first metal structure 12 during formation of the flip chip interconnect bond. A wire 46 may be bonded to the exposed contact surface 16 of the first metal structure 10, and the wire 46 may be bonded after bonding the second substrate 42 to the first substrate 10. However, it is to be appreciated that in other embodiments the wire 46 may be bonded to the first metal structure 12 at various stages during fabrication, either before or after bonding the second substrate 42 to the first substrate 10. In embodiments, the wire 46 is bonded to the exposed contact surface 16 of the first metal structure 12 through the bond mask 26, with the bond mask 26 remaining in place after fabrication and with the wire 46 pushed through the bond mask 26. Alternatively and although not shown, it is to be appreciated that the bond mask 26 may be removed after formation of the flip chip interconnect bond. The wire 46 may be bonded to a third substrate 48 that is separate from the first substrate 10 and the second substrate 42 to form an electrical connection between the first substrate 10 and the third substrate 48, thereby enabling external electrical connection independent of the flip chip interconnect bonding employed to bond the first substrate 10 and the second substrate 42. As a result and as shown in FIG. 13, an article 50 that includes bonded metal structures is formed with the second substrate 42 bonded to the first substrate 10 through the exposed contact surface 18 of the second metal structure 14 in the absence of a bond between the second substrate 42 and the exposed contact surface 16 of the first metal structure 12. Further, the wire 46 is bonded to the exposed contact surface 16 of the first metal structure 12.

Figure 14:
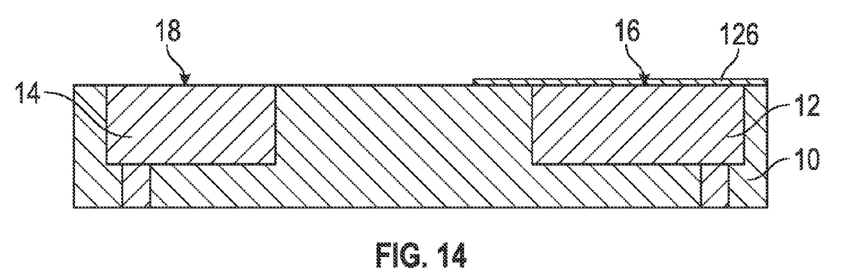
FIGS. 14 and 15 illustrate another method of preparing an article including bonded metal structures in accordance with an alternative exemplary embodiment.

Another exemplary embodiment of a method of preparing an article including bonded metal structures will now be described with reference to FIGS. 14 and 15. In accordance with this embodiment and referring to FIG. 14, the first substrate 10 is provided in the same manner as described above. However, instead of forming the metal pillar and solder bump, diffusion bonding is employed in this embodiment to facilitate flip chip interconnect bonding. In this embodiment, a bond mask 126 is formed over the first substrate 10, including over the exposed contact surface 16 of the first metal structure 12. The bond mask 126 can be formed by depositing a resist over the bond mask 126 and patterning the resist to selectively expose a portion of the bond mask 126 that overlies the second metal structure 14 and that is to be removed. After removal of the portion of the bond mask 126 that overlies the second metal structure 14 and as shown in FIG. 14, the resist may be removed. Surface pretreatment may be conducted in anticipation of conducting conventional diffusion bonding of metal structures to the exposed contact surface 18 of the second metal structure 14.

Figure 15:
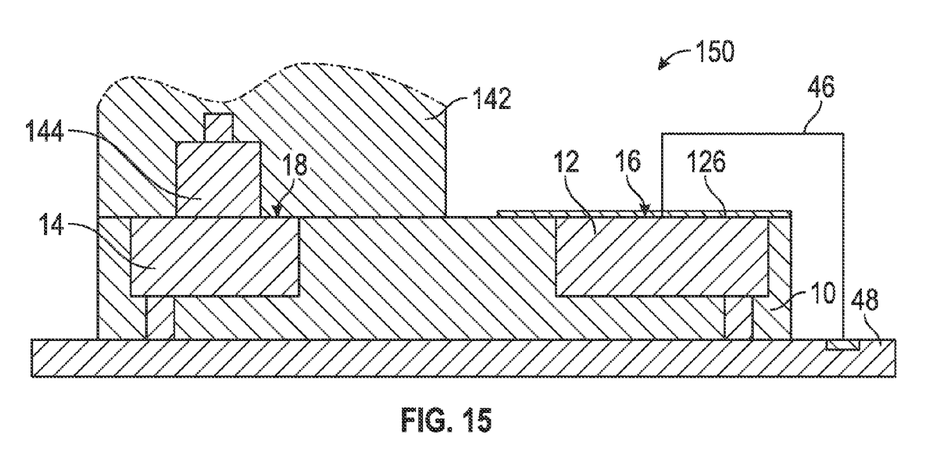

Referring to FIG. 15, a second substrate 142 is bonded to the first substrate 10 through the exposed contact surface 18 of the second metal structure 14 using diffusion bonding. In particular, the second substrate 142 may include a second electronic device (such as another integrated circuit) and the second substrate 142 may have a corresponding metal structure 144 positioned to bond to the exposed contact surface 18 of the second metal structure 14. In embodiments, the second substrate 142 is another die and bonding of the first substrate 10 and the second substrate 142 may be die-to-wafer or die-to-die bonding. The bond mask 126 remains disposed over the exposed contact surface 16 of the first metal structure 12 during bonding of the second substrate 142 to the first substrate 10 to protect the first metal structure 12 during formation of the diffusion bond. A wire 46 may be bonded to the exposed contact surface 16 of the first metal structure 10 in the same manner as described above. The wire 46 may be bonded to a third substrate 48 as also described above. As a result and as shown in FIG. 15, an article 150 that includes bonded metal structures is formed with the second substrate 142 bonded to the first substrate 10 through the exposed contact surface 18 of the second metal structure 14 in the absence of a bond between the second substrate 142 and the exposed contact surface 16 of the first metal structure 12. Further, the wire 46 is bonded to the exposed contact surface 16 of the first metal structure 12.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure.

What is claimed is:

1. A method of preparing an article including bonded metal structures, the method comprising:
    providing a first substrate;
    forming a first metal structure and a second metal structure on the first substrate, wherein the first metal structure and the second metal structure each comprise an exposed contact surface;
    forming a bond mask over the contact surface of the first metal structure;
    providing a second substrate comprising a corresponding metal structure positioned to bond to the exposed contact surface of the second metal structure;
    bonding the second substrate to the first substrate through the exposed contact surface of the second metal structure of the first substrate and the corresponding metal structure of the second substrate, wherein the bond mask remains disposed over the exposed contact surface of the second metal structure during bonding of the second substrate to the first substrate; and
    bonding a wire to the exposed contact surface of the first metal structure.

2. The method of claim 1, wherein bonding the wire to the exposed contact surface of the first metal structure comprises bonding the wire to the exposed contact surface of the first metal structure after bonding the second substrate to the first substrate.

3. The method of claim 1, wherein bonding the wire to the exposed contact surface of the first metal structure comprises bonding the wire to the exposed contact surface of the first metal structure through the bond mask.

4. The method of claim 1, further comprising bonding the wire to a third substrate separate from the first substrate and the second substrate to form an electrical connection between the first substrate and the third substrate.

5. The method of claim 1, further comprising forming a solder bump over the exposed contact surface of the second metal structure.

6. The method of claim 5, further comprising forming a dielectric structure over the first substrate with recesses formed therethrough and exposing the exposed contact surfaces of the first metal structure and second metal structure prior to forming the bond mask over the contact surface of the first metal structure.

7. The method of claim 6, wherein forming the bond mask comprises blanket-forming the bond mask over the dielectric structure and in the recesses, over the exposed contact surfaces of the first metal structure and the second metal structure.

8. The method of claim 7, wherein forming the bond mask further comprises selectively removing the bond mask from over the exposed contact surface of the second metal structure.

9. The method of claim 5, further comprising forming an under-bump metallization layer over the exposed contact surface of the second metal structure, over the dielectric structure, and over the bond mask over the contact surface of the first metal structure.

10. The method of claim 9, further comprising patterning a second resist over the under-bump metallization layer to define a pillar recess in the second resist over the under-bump metallization layer that overlies the second metal structure, wherein the second resist masks the bond mask and is free from a pillar recess over the first metal structure.

11. The method of claim 10, wherein a metal pillar is formed in the pillar recess and wherein forming the solder bump over the exposed contact surface of the second metal structure comprises forming a solder layer over the metal pillar.

12. The method of claim 1, wherein bonding the second substrate to the first substrate comprises bonding the second substrate to the first substrate through the exposed contact surface of the second metal structure using diffusion bonding.

13. A method of preparing an article including bonded metal structures, the method comprising:
    providing a first substrate;
    forming a first metal structure and a second metal structure on the first substrate, wherein the first metal structure and the second metal structure each comprise an exposed contact surface;
    forming a bond mask over the contact surface of the first metal structure;
    bonding a second substrate to the first substrate through the exposed contact surface of the second metal structure through a flip chip interconnect configuration, wherein the bond mask remains disposed over the exposed contact surface of the second metal structure during bonding of the second substrate to the first substrate; and
    bonding a wire to the exposed contact surface of the first metal structure.

14. A method of preparing an article including bonded metal structures, the method comprising:
    providing a first substrate;
    forming a first metal structure and a second metal structure on the first substrate, wherein the first metal structure and the second metal structure each comprise an exposed contact surface;
    forming a bond mask over the contact surface of the first metal structure;
    bonding a second substrate to the first substrate through the exposed contact surface of the second metal structure through a flip chip interconnect configuration, wherein the bond mask remains disposed over the exposed contact surface of the second metal structure during bonding of the second substrate to the first substrate; and
    bonding a wire to the exposed contact surface of the first metal structure through the bond mask disposed over and completely covering the exposed contact surface of the first metal structure.

* * * * *